United States Patent
Mirgorodski et al.

(10) Patent No.: US 7,339,835 B1
(45) Date of Patent: Mar. 4, 2008

(54) NON-VOLATILE MEMORY STRUCTURE AND ERASE METHOD WITH FLOATING GATE VOLTAGE CONTROL

(75) Inventors: Yuri Mirgorodski, Sunnyvale, CA (US); Peter J. Hopper, San Jose, CA (US); Vladislav Vashchenko, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/057,355

(22) Filed: Feb. 14, 2005

(51) Int. Cl.
*G11C 11/34* (2006.01)

(52) U.S. Cl. .................................. 365/185.29

(58) Field of Classification Search ........ 257/314–316, 257/323–325; 365/185.29, 185.28
See application file for complete search history.

(56) References Cited

U.S. PATENT DOCUMENTS

| 4,698,787 | A | | 10/1987 | Mukherjee et al. ......... 365/185 |
| 5,235,541 | A | * | 8/1993 | Edme et al. ............ 365/185.04 |
| 5,736,764 | A | * | 4/1998 | Chang ........................ 257/318 |
| 6,137,723 | A | | 10/2000 | Bergemont ............ 365/185.28 |
| 6,914,826 | B2 | * | 7/2005 | Hung et al. ............ 365/185.28 |

* cited by examiner

*Primary Examiner*—Lynne Gurley
*Assistant Examiner*—Colleen Matthews
(74) *Attorney, Agent, or Firm*—Stallman & Pollock LLP

(57) ABSTRACT

Feedback between the floating gate voltage and a high erase voltage is utilized in the erase operation of a non-volatile memory (NVM) cell. Erasing stops when the floating gate voltage reaches the threshold voltage of the controlling transistor, making the variability of the NVM cell's threshold voltage the same as a regular device in the integrated circuit structure, thereby reducing the significant threshold voltage variability in erased NVM cells.

1 Claim, 5 Drawing Sheets

NON-VOLATILE MEMORY STRUCTURE AND ERASE METHOD WITH FLOATING GATE VOLTAGE CONTROL

TECHNICAL FIELD

The present invention relates to a non-volatile memory (NVM) cell structure and erasing method that utilizes feedback between floating gate and erase voltages, rather than conventional tunneling current control, to improve the threshold voltage ($V_T$) distribution of the erased cell.

DESCRIPTION OF THE INVENTION

Figure 1:
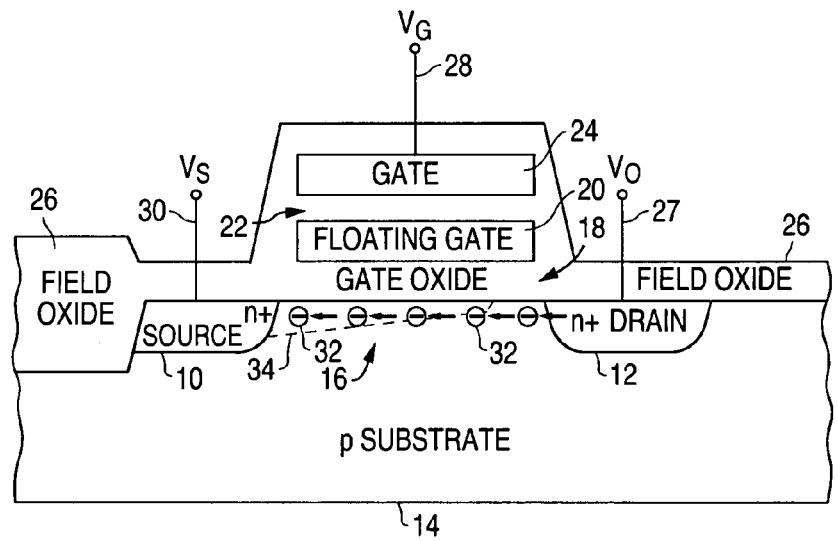
FIG. 1 is a partial cross-section drawing illustrating a conventional electrically programmable read only memory (EPROM) cell structure.

U.S. Pat. No. 4,698,787, issued on Oct. 6, 1987, discloses as prior art the conventional electrically programmable read only memory (EPROM) device structure shown in FIG. 1. The FIG. 1 EPROM transistor device includes a source 10 and a drain 12 formed on a semiconductor substrate 14. The source 10 and the drain 12 define a channel 16 in the substrate 14. Positioned above the channel 16 is layer of insulating material that forms a gate dielectric layer 18. A floating gate 20 of semiconductor material is formed over the gate dielectric layer 18. A second layer 22 of insulating material is formed over the floating gate 20. Finally, a layer of semiconductor material is formed over the second layer of insulating material 22 to form a control gate 24. Field oxide 26 isolates the transistor structure from periphery devices. Electrical connections 26, 28 and 30 are provided for applying voltages to the drain region 12, control gate 24 and source region 10, respectively.

The significant disadvantage of the FIG. 1 EPROM cell structure is the requirement that the cell be erased by exposure to ultraviolet light. When EPROM cells are configured in an array, effectively all cells in the array are erased together. Thus, when changes need to be made to data stored in an EPROM array, even when the changes are minor, the entire array must be erased and the entire new data structure rewritten into the array.

Figure 2:
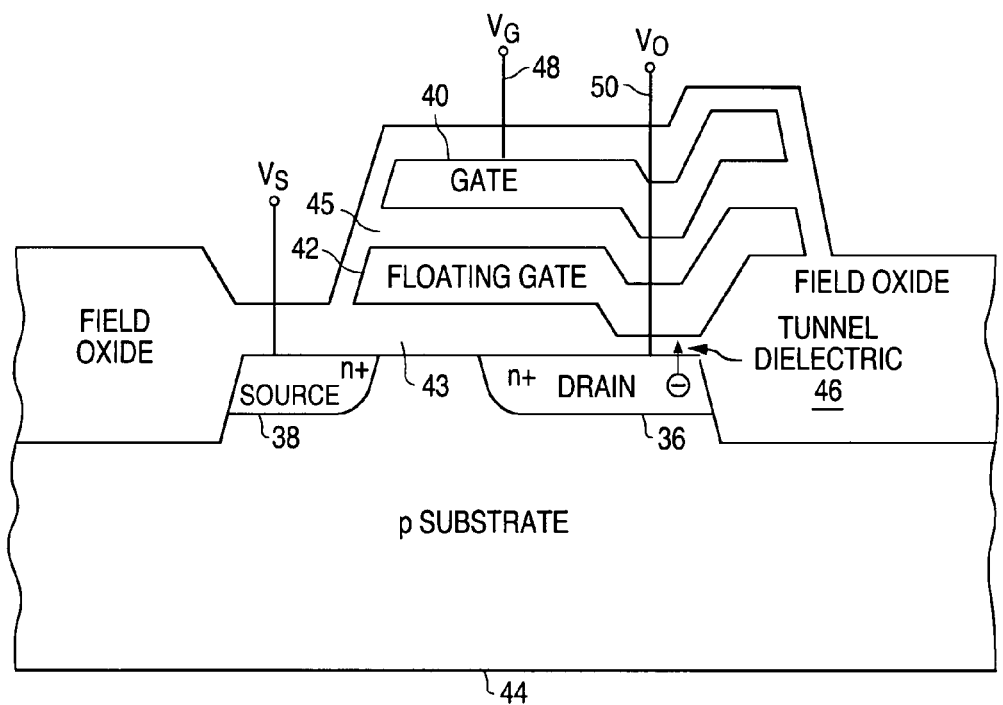
FIG. 2 is a partial cross-section drawing illustrating a conventional electrically erasable programmable read only memory (EEPROM) cell structure.

The above-cited '787 patent also discloses an erasing method for an electrically erasable programmable read only memory (EEPROM) cell of the type shown in FIG. 2. As with the FIG. 1 EPROM cell structure, the FIG. 2 EEPROM cell structure includes a drain 36 and a source 38 formed in a semiconductor substrate 44, and a floating gate separated from the substrate 44 by gate oxide layer 43. The EEPROM cell structure differs from the EPROM cell structure in that it provides a thin tunnel dielectric 46 between the drain region 36 and the floating gate 42. As shown in FIG. 2, a portion of the floating gate 42 that is positioned above the tunnel dielectric 46 is also positioned above the drain region 36.

Erasing of the FIG. 2 EEPROM cell structure is achieved by inducing potential differences between the control gate 40 and the drain region 36. The thin dielectric region 46 coupled with the high voltages between the control gate 40 and the drain 36 induces "Fowler-Nordheim tunneling" of electrons from the programmed floating gate 42 to the drain region 36. That is, to erase the FIG. 2 cell, the control gate is held at ground potential while the drain 36 is pulsed for approximately 10 milliseconds at a potential of approximately 20V; the source region 38 is allowed to float. Under these conditions, as discussed above, electrons can tunnel through the tunnel dielectric from the floating gate 42.

Figure 3A:
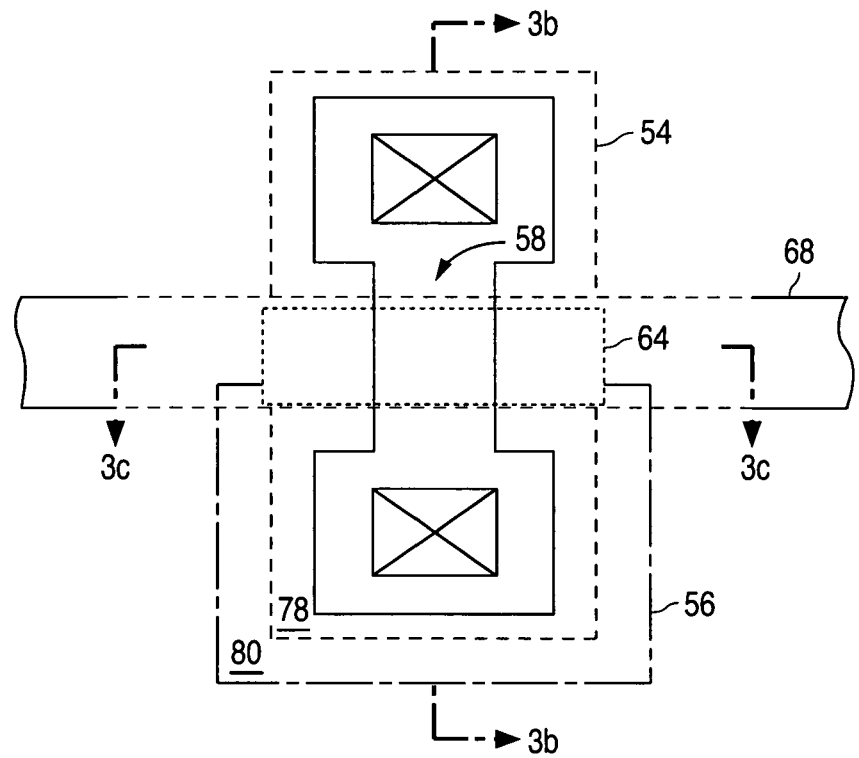
FIGS. 3a and 3b are, respectively, a plan view and a partial cross-section drawing illustrating an alternate embodiment of a conventional EEPROM cell structure.
Figure 3B:
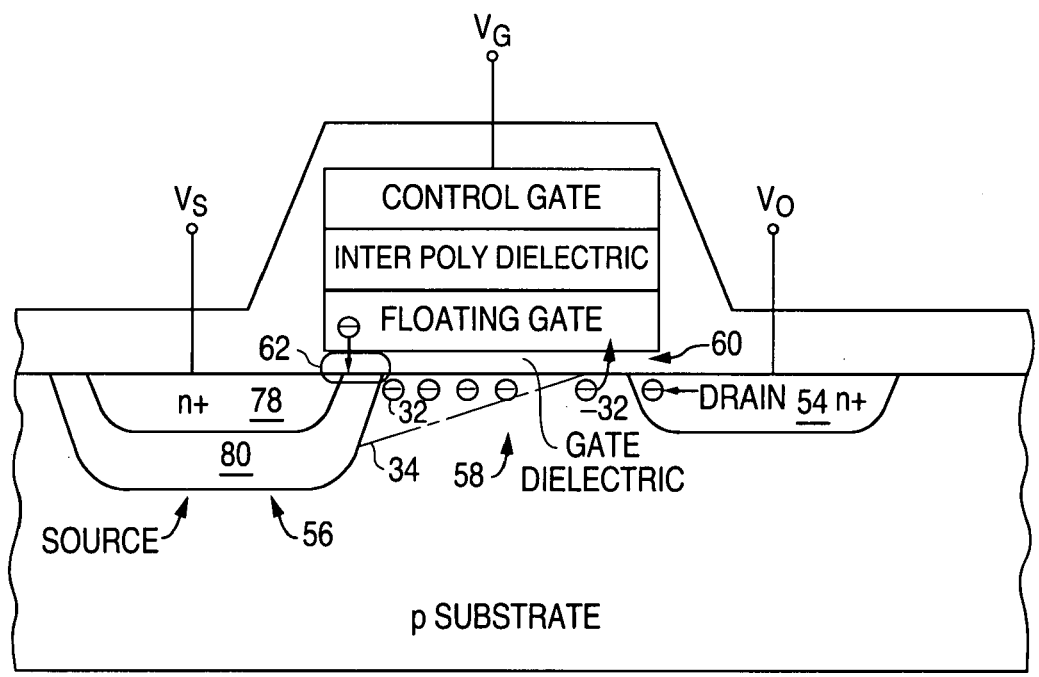

The '787 patent also discloses another EEPROM cell structure, shown in FIGS. 3a and 3b. In this structure, a relatively shallow drain region 54 a deeper source region 56 are formed in a silicon substrate 52. A channel 58 is defined between the source 56 and the drain 54. A gate dielectric 60 is formed over the channel region 58 and extends over the channel 58 and to extend between the drain 54 and to overlap a portion of the source 56. The gate dielectric has relatively uniform thickness over its entire cross section. A floating gate 64 is formed over the gate dielectric 60. A second layer of dielectric material 66 is formed over the floating gate 64. A control gate 68 is formed over the second layer of insulating material 66.

Erasing of the EEPROM cell shown in FIGS. 3a and 3b is achieved by floating the drain 54, holding the control gate 68 at ground potential, and applying a pulse of high voltage, e.g. 10-13V for 0.5-5 msec., to the source 56. Under these conditions, Fowler-Nordheim tunneling occurs between the floating gate 64 and the portion 62 of the source region 56 that underlies the floating gate 64.

As indicated above, the typical erase method for a non-volatile memory cell involves a tunneling mechanism that removes electrons from the cell's floating gate. This erase technique may better understood with reference to the FIG. 4 NVM structure 100, which shows a P+ diffusion region 102 in an n-well 104 formed in a semiconductor substrate 106. The N+ source region 108 and the N+ drain region 110 of the NVM cell are formed in a substrate p-well 112 that provides the control gate of the NVM cell 100. A floating gate electrode (FG) is insulated by dielectric material 114. The N-well 104 and the p-well 112 are separated by shallow trench isolation (STI) dielectric.

Figure 4:
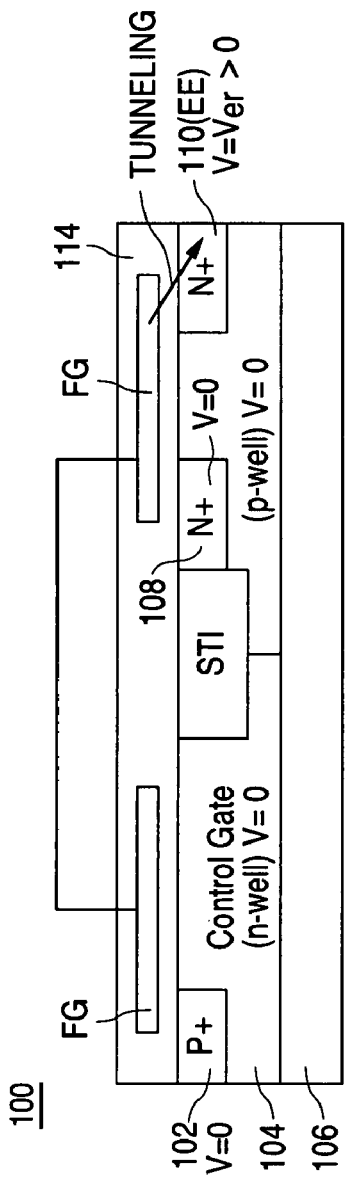
FIG. 4 is a schematic drawing useful in discussing an erase operation for a conventional non-volatile memory (NVM) cell.

In an erase operation for the FIG. 4 NVM cell 100, a positive erase voltage $V_{er}$ that is high relative to the control gate is applied to the erase electrode (EE), drain region 110 in the cell structure 100. The control gate is grounded and, due to the high coupling to the floating gate (FG), keeps the floating gate (FG) at low voltage. Tunneling current from the floating gate (FG) to the erase electrode (EE) is high at the beginning of the erase operation. As the erase operation continues, the floating gate voltage becomes more positive as a result of the electric field between the floating gate (FG) and the erase electrode (EE); since the tunneling current is a strong function of this electric field, it becomes smaller with time. As soon as the tunneling current is substantially equal to zero, the erase mechanism stops. Thus, as one skilled in the art will appreciate, the charge remaining on the floating gate (FG) and, in turn, the threshold voltage $V_T$ of the cell 100, depends upon a tunneling mechanism is sensitive to process parameters.

The concept of the present invention is to control the tunneling current in an erase operation for a non-volatile memory cell using the floating gate voltage directly using a feedback mechanism. The features and advantages of the present invention will be more fully appreciated upon consideration of the following detailed description of the invention and the accompanying drawings that set forth an illustrative embodiment in which the principles of the invention are utilized.

Figure 5:
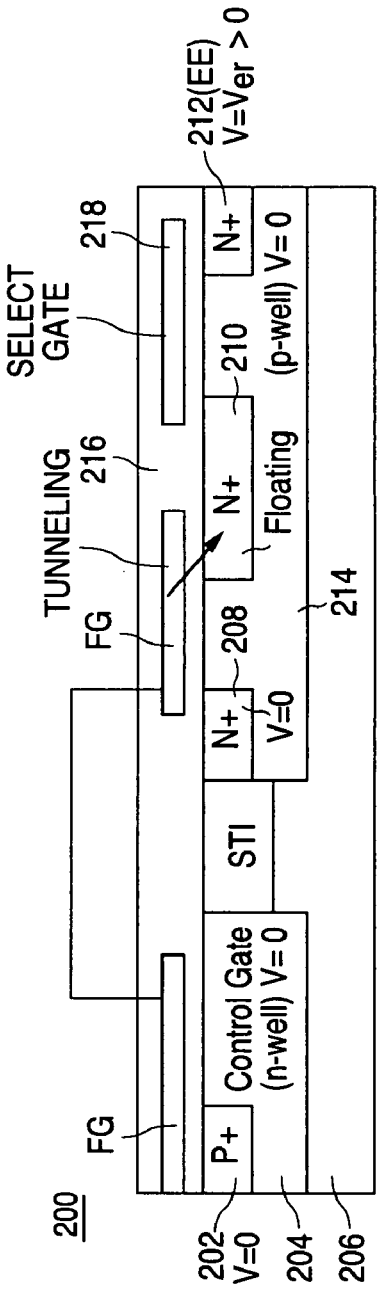
FIG. 5 is a schematic drawing useful in discussing an erase operation for a NVM cell structure in accordance with the concepts of the present invention.

A non-volatile memory cell structure 200 in accordance with the concepts of the present invention is shown in FIG. 5. The NVM cell structure 200 includes a P+ diffusion region 202 formed in an n-well 204 that is formed in a semiconductor substrate 206 and provides the control gate for the NVM cell 200. A first N+ region 208, a second N+ region 210 and a third N+ region 212 are formed in a substrate p-well 114. The floating gate electrode (FG) of the cell structure 200 is insulated by dielectric material 216. Compared with the NVM structure 100 shown in FIG. 4, the FIG. 5 NVM cell structure 200 includes a floating N+ region 210 and a select gate. As shown in FIG. 5, the cell structure 200 provides two NMOS transistors in sequence. The first NMOS transistor includes the first N+ region 208 and the floating N+ region 210 and is controlled by the floating gate electrode (FG). The second NMOS transistor includes the floating N+ region 210 and the third N+ region 212 and is controlled by the select gate 218.

Those skilled in the art will appreciate that, while the structure of the NVM cell 200 is new, it can be fabricated utilizing individual process steps and materials that are well know in the industry.

Just prior to the initiation of an erase operation, the N+ floating region 210 is discharged and has a low voltage, the floating gate (FG) also has a low voltage, the select gate voltage is zero and both NMOS transistors are off.

To erase the NVM cell 200, the select gate receives high voltage for an erase time $E_T$; after the erase time $E_T$, the select gate voltage is returned to zero. When the select gate voltage is high, the first NMOS transistor is off, the second NMOS transistor is on. Under these conditions, the floating N+ region 210 is quickly charged to approximately the erase voltage $V_{er}$ and tunneling current from the floating gate (FG) to the N+ region starts the regular erase mechanism. The erase time $E_T$ should be long enough to allow the floating gate voltage to come close to but still below the threshold voltage $V_T$ of the NMOS transistor. After the select gate voltage has been returned to zero, the second NMOS transistor is off, but erasing continues because the floating N+ region 210 still has a high voltage (the capacitance of the floating N+ region 210 should be high enough). When the floating gate voltage comes to the threshold voltage $V_T$ of the NMOS transistor, the first NMOS transistor is on, the floating N+ region 210 discharges through it, and erasing stops. Thus, in accordance with the invention, the erase operation is under the control of the floating gate voltage, not the tunneling current as in the conventional NVM erase operation.

Figure 6A:
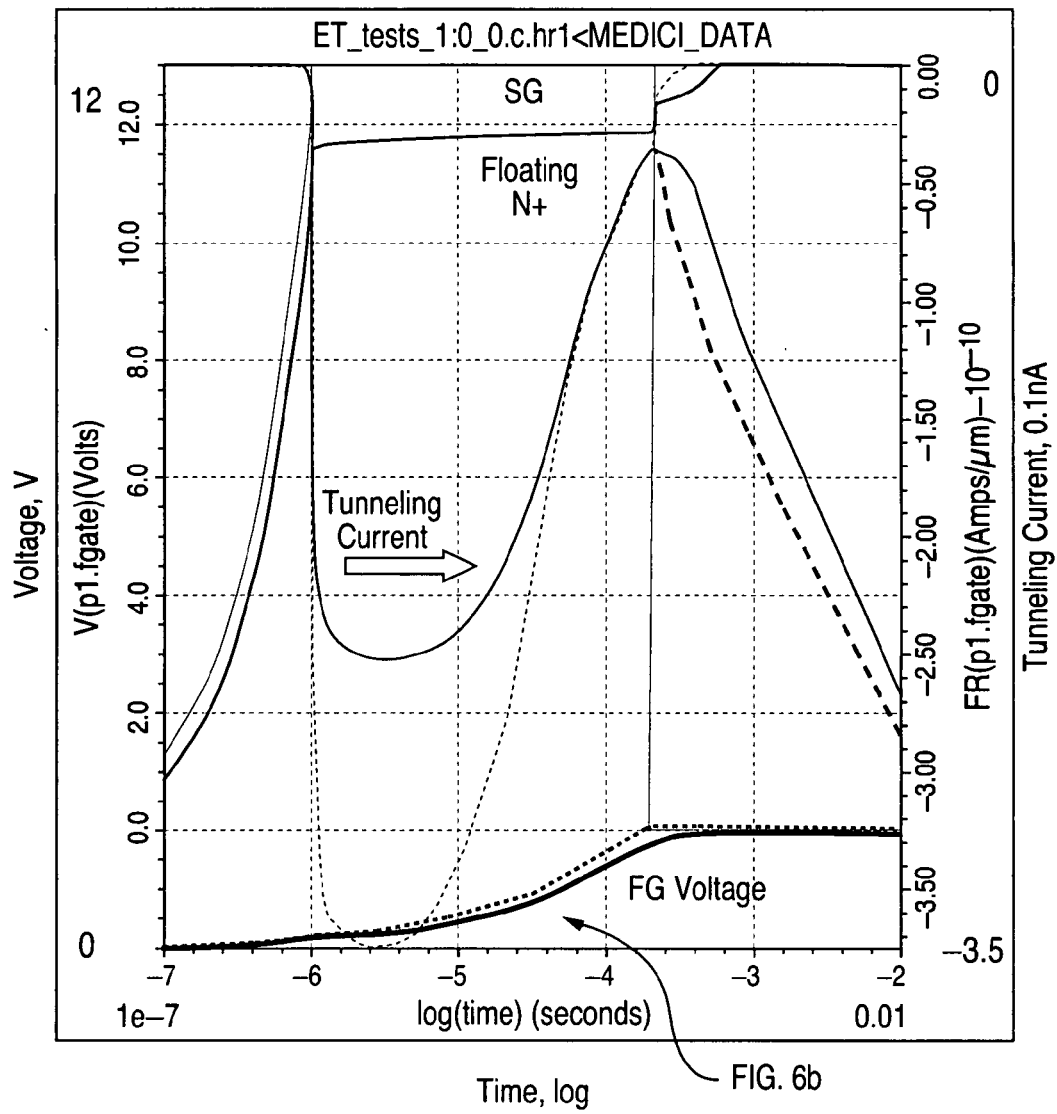
FIG. 6 provides a plot showing floating gate voltage over time in an NVM erase operation in accordance with the concepts of the present invention.
Figure 6B:
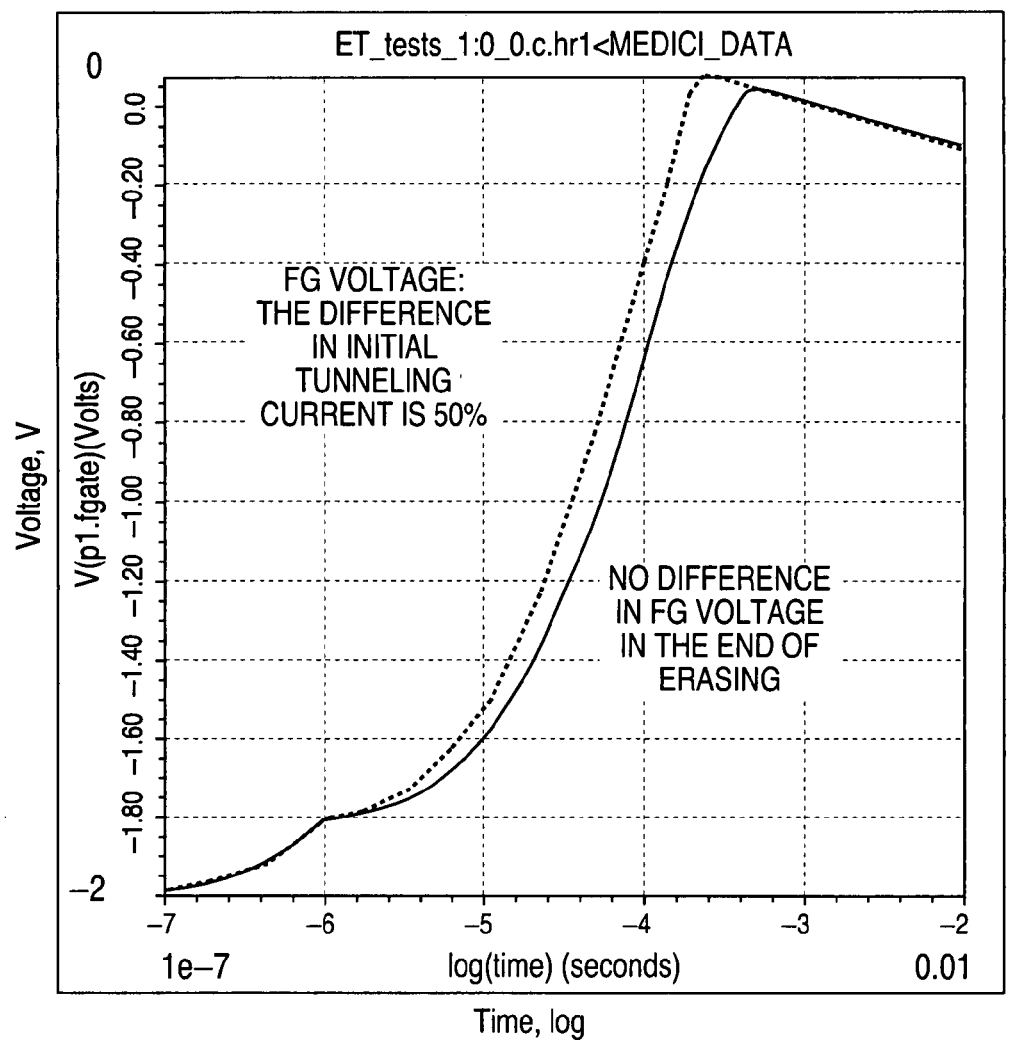

FIG. 6 provides simulation results for the above-described erase operation.

It should be understood that the particular embodiments of the invention described above have been provided by way of example and that other modifications may occur to those skilled in the art without departing from the scope and spirit of the invention as expressed in the appended claims and their equivalents.

What is claimed is:

1. A method of erasing a non-volatile memory (NVM) cell, the NVM cell including a first NMOS transistor and a second NMOS transistor formed in p-type semiconductor material, the first NMOS transistor having a first n-type diffusion region, a second n-type diffusion region spaced apart from the first n-type diffusion region to define a first p-type channel region therebetween and a conductive floating gate having a first portion thereof formed over the first p-type channel region and separated therefrom by intervening dielectric material, the second NMOS transistor having a third n-type diffusion region that is spaced apart from the second n-type diffusion region to define a second p-type channel region therebetween and a conductive select gate formed over the second p-type channel region and separated therefrom by intervening dielectric material, the NVM cell further including a conductive control gate that includes an n-type control gate diffusion region formed in the p-type semiconductor material in proximity to a second portion of the conductive floating gate and separated therefrom by intervening dielectric material, the method comprising:

discharging the second n-type diffusion region, maintaining the conductive floating gate at low voltage, maintaining the conductive select gate at zero volts, and maintaining the first and second NMOS transistors in an off state;

raising the conductive select gate from zero voltage to a high voltage for an erase time such that, during the erase time, the first NMOS transistor is off and the second NMOS transistor is on, whereby tunneling current flows from the conductive floating gate to the second n-type diffusion region, the erase time being such that the floating gate voltage comes close to but remains below the threshold voltage of the first NMOS transistor;

after the erase time has elapsed, returning the conductive select gate to zero voltage, such that the second NMOS transistor is off, but current flow continues from the conductive floating gate to the second n-type region until the floating gate voltage comes to the threshold voltage of the first NMOS transistor, whereby the first NMOS transistor turns on, the second N-type region discharges and current flow from the conductive floating gate to the second n-type region stops.

\* \* \* \* \*